United States Patent [19]

Farahani et al.

[11] Patent Number: 5,612,253
[45] Date of Patent: Mar. 18, 1997

[54] METHOD FOR FORMING ORDERED TITANIUM NITRIDE AND TITANIUM SILICIDE UPON A SEMICONDUCTOR WAFER USING A THREE-STEP ANNEAL PROCESS

[75] Inventors: M. M. Farahani; Shyam Garg, both of Austin, Tex.

[73] Assignee: Advanced Micro Devices, Inc., Austin, Tex.

[21] Appl. No.: 382,217

[22] Filed: Jan. 31, 1995

[51] Int. Cl.$^6$ ............................................. H01L 21/28
[52] U.S. Cl. ........................ 437/190; 437/192; 437/200
[58] Field of Search .................................. 437/190, 192, 437/200

[56] References Cited

U.S. PATENT DOCUMENTS

| | | | |
|---|---|---|---|
| 4,784,973 | 11/1988 | Stevens et al. | 437/192 |
| 4,998,157 | 3/1991 | Yokoyama et al. | 437/200 |
| 5,023,201 | 6/1991 | Stanasolovich et al. | 437/192 |
| 5,043,300 | 8/1991 | Nulman | 437/200 |
| 5,047,367 | 9/1991 | Wei et al. | 437/200 |
| 5,236,868 | 8/1993 | Nulman | 437/200 |
| 5,278,099 | 1/1994 | Maeda | 437/190 |

OTHER PUBLICATIONS

Wolf, *Silicon Processing for the VLSI ERA;* vol. 2; Process Integration, (Lattice Press, 1990), pp. 20–27.

Farahani, "Conventional Contact Interconnect Technology as an Alternative to Contact Plug (W) Technology for 0.85 μm CMOS EPROM IC Devices", *IEEE Transactions On Semiconductor Manufacturing,* vol. 7, No. 1, Feb. 1994, pp. 79–86.

Farahani, "A Study fo Electrical, Metallurgical, and Mechanical Behaviors of Rapid Thermal Processed Ti Films in NH$_3$,", *Journal of the Electrochemical Society;* vol. 141, No. 2, Feb. 1994, pp. 479–496.

*Primary Examiner*—John Niebling
*Assistant Examiner*—Thomas G. Bilodeau
*Attorney, Agent, or Firm*—Kevin L. Daffer; Conley, Rose & Tayon

[57] ABSTRACT

An improved method is provided for fabricating a metallization structure upon a semiconductor wafer. The method performs nitridation upon a sputter-deposited Ti layer over junction regions prior to silicidation thereof. Further, nitridation and silicidation are each performed at controlled amounts within the Ti layer overlying field dielectric regions, also included in the semiconductor wafer. Nitridation and silicidation thereby occur during a three-step anneal process of a previously deposited Ti layer. The three anneal steps are carried forward at separate and distinct temperatures, wherein the first anneal temperature is followed by a second, higher anneal temperature, and wherein the second anneal cycle is followed by a third anneal cycle of higher temperature than the first or second anneal temperatures. The resulting TiN/Ti/TiSi$_2$ tri-layer is optimized having the thickest possible TiN film over the junctions and dielectric regions, and further having excellent adherence of the TiN film to the dielectric.

16 Claims, 6 Drawing Sheets

METHOD FOR FORMING ORDERED TITANIUM NITRIDE AND TITANIUM SILICIDE UPON A SEMICONDUCTOR WAFER USING A THREE-STEP ANNEAL PROCESS

BACKGROUND OF THE INVENTION

1. Field of the Invention

This invention relates to integrated circuit fabrication and more particularly to an improved process for forming a metallization layer having optimally sized barrier and silicide layers.

2. Description of the Relevant Art

Fabrication of an integrated circuit involves numerous processing steps. After impurity regions have been deposited within a semiconductor substrate and gate areas as well as field areas defined upon the substrate, interconnect routing is placed on the semiconductor topography and connected to contact areas thereon to form an integrated circuit. The entire process of making an ohmic contact to the active areas and routing interconnect material between active areas is described generally as "metallization". While materials other than metals are often used, the term metallization is generic in its application, and is derived from the origins of interconnect technology, where metals were the first conductors used. As the complexity of integrated circuits has increased, the complexity of the metallization structure has also increased.

Each level of metallization incorporates specific materials to enhance contact resistivity and adherence to underlying films/substrate. The low resistivity of aluminum, excellent adherence to both silicon and silicon dioxide, and the low ohmic contact aluminum makes to silicon assures it as an attractive conductor for use in a multilayer metallization scheme. Aluminum can be easily deposited on silicon using conventional techniques such as evaporation or sputtering. Unfortunately, with the advent of high density integrated circuits having thinner diffusion junctions, some of the other properties of aluminum have prevented its applicability as the sole metallization composition. The adherence of aluminum to silicon and silicon dioxide dictates a relatively high solubility of silicon in aluminum at elevated temperatures. The grain boundaries of aluminum thin films provide an avenue through which underlying silicon can diffuse at temperatures above, for example, 400° C. The diffusivity of silicon in aluminum can result in what is often called "junction spiking". Junction spiking refers to voiding of silicon and movement of aluminum into the voided silicon at the junction region thereby causing, in the extreme, aluminum penetration completely through the shallow junction. Complete aluminum penetration can therefore lead to shorting of the junction.

In order to avoid problems of junction spiking, aluminum may be deposited saturated with silicon. The saturated aluminum is thereby rendered unable to absorb substantial amount of additional silicon when contacted with the substrate. Although saturated aluminum minimizes junction spiking, it often generates other problems. For example, saturated aluminum causes nucleation and growth of silicon precipitates from the saturated aluminum material during cooling cycles associated with wafer fabrication. Such precipitation occurs at the contact between the saturated aluminum and the underlying silicon and consists primarily of p-type silicon (since aluminum is a p-type dopant in silicon) doped with aluminum to a fairly high concentration level. P-type precipitates formed at the interface of an n-type junction undesirably increases the contact resistance of that junction. For small n-type contact areas, the increase in resistivity attributed to those precipitates can be sufficient to render a low voltage circuit inoperable.

More recent studies in contact technology have generally drawn away from saturated aluminum as a mechanism for alleviating junction spiking. Researchers have begun to focus upon using what is often called "diffusion barriers". A diffusion barrier is defined as part of the metallization scheme, and comprises a layer of material interposed between an overlying conductor such as aluminum (Al) and an underlying contact region such as doped silicon (Si) or doped/undoped dielectric. The overall structure is therefore a multi-layer structure. The role of a diffusion barrier is to prevent or at least retard interdiffusion of material on opposite sides of the barrier into one another. Thus, an optimal diffusion barrier is one which lessens interdiffusion between materials on opposite sides of the barrier, is stable in the presence of those materials, demonstrates low contact resistivity at the junction of those materials, and has coefficients of thermal expansion compatible with each material.

There are many types of diffusion barriers, including passive barriers, sacrificial barriers, and stuffed barriers. A typical stuffed barrier is a sputter-deposited titanium-tungsten material interposed between the contact region and overlying Al. Sacrificial barriers include interposed polysilicon or titanium (Ti) layers. Recent literature has demonstrated the advantages of passive barriers over conventional stuffed or sacrificial barriers, and generally point to the use of titanium nitride (TiN) as the passive barrier material of choice. See, e.g., U.S. Pat. No. 5,043,300 to Nulman; U.S. Pat. No. 5,278,099 to Maeda; and, U.S. Pat. No. 4,998,157 to Yokoyama et al. (herein incorporated by reference).

Most passive barriers use TiN as the barrier coupled to the substrate material via a Ti layer. The Ti layer is used to reduce contact resistivity of the overall TiN/Ti structure. When TiN is used as the diffusion barrier between Ti and Al, the thermal stability of the contact metallization is reported as being very good. See, e.g., Wolfe, Silicon Processing for VLSI Era; Vol. 2; Process Integration, (Lattice Press, 1990), pp. 132–133 (herein incorporated by reference). According to many conventional techniques, the Ti layer is sputter deposited from a relatively pure titanium target onto the exposed semiconductor wafer. After Ti has been deposited, TiN is sputter deposited upon the Ti-covered semiconductor wafer usually from a titanium target within a nitrogen ambient. Formation of Ti and TiN layers thereby involves dual sputter chambers. Further, sputter deposited TiN introduces large quantities of contaminants during the sputter operation. Generally speaking, sputter-deposited TiN diffusion barrier produces a brittle thin film with poor adhesion to the sputtering system components. A large number of particles are thereby generated during the sputter process which results in a significant increase in deleterious particulate matter deposited upon the wafer.

To avoid sputter downtime and to enhance wafer throughput, many researchers have discovered the advantages of a single sputter deposition step, wherein Ti is sputter deposited, and TiN is formed therefrom. Specifically, TiN can be formed from a Ti layer in one of several ways. First, Ti can be evaporated in a nitrogen ambient. Second, Ti can be reactively sputtered in a nitrogen-bearing gas ambient. Third, Ti can be sputter deposited and thereafter converted to TiN at the Ti exposed surface in a separate plasma nitridation step. Conversion of Ti to TiN according to the third process sequence presents an advantage in that Ti can be converted to TiN simultaneous with conversion of Ti to titanium silicide (TiSi$_x$) at opposing surfaces of the Ti layer. Thus, nitridation of the Ti layer occurs at a high temperature necessary to produce a TiN passive barrier at the Ti upper surface during silicidation at the Ti lower surface (i.e., at the Ti-semiconductor wafer interface).

Ti nitridation and silicidation can advantageously be performed by rapid thermal heating, sometimes called "rapid thermal annealing" (RTA). The problem inherent in nitridation and silicidation is the competing nature of silicon and nitrogen ingress into the Ti film. As described in Farahani, et al. "A Study of Electrical, Metallurgical, and Mechanical Behaviors of Rapid Thermal Process Ti Films in NH$_3$", *Journal of Electrochemical Society*, Vol. 141, No. 2, February, 1994 (herein incorporated by reference), a more complete nitridation of Ti is sometimes preempted by the growing silicide layer underneath the growing TiN. Thus, TiN layers formed during a single RTA cycle, which simultaneously forms TiSi$_x$, are quite thin. An RTA temperature of 700° C. necessary to form TiSi$_x$ will form predominately TiSi$_x$ instead of TiN, even through RTA is performed in a nitrogen ambient. This result is especially true when performed in a pure N$_2$ ambient. N$_2$ generally requires a much higher temperature to segregate and form TiN, and therefore, in the meantime, a disproportionate amount of TiSi$_x$ will be formed. The small amount of TiN will not be sufficient to produce a proper passive barrier structure, as described in the immediately preceding article. A thin TiN diffusion barrier (i.e., less than 200 Angstroms) produces unacceptably high junction leakage current and unacceptably low breakdown voltage. The problem is less prevalent in As implant junctions of n-type circuits. It appears the As implants reduce the rate of TiSi$_x$ phase formation by impeding the diffusion of Si into the Ti film. Thus, a larger amount of TiN can form over n-type junctions. The problem is, however, more prevalent in p-type junctions since B or BF$_x$ impurities do not produce the same silicide-reducing effect as As impurities. Therefore, over p-type junctions of, for example, 140×70 μm$^2$ having B concentration of 7×10$^{16}$ atoms/cm$^3$, a breakdown voltage of less than 12 volts may occur.

To produce an optimal metallization scheme, the TiN layer must not only be thick in regions overlying p-type junctions, but also the TiN/Ti/TiSi$_x$ tri-layer must have strong adhesion to the underlying junction. In many instances, the TiN/Ti/TiSi$_x$ tri-layer acts as a "glue layer". The tri-layer is interposed between a subsequently placed "plug-layer" and the junction region of a semiconductor surface. Thus, the tri-layer serves to adhere the junction to an overlying plug layer, a suitable plug consists essentially of tungsten (W) material. The W plug is typically CVD formed across the semiconductor wafer and especially in the relatively deep contact holes overlying junction regions. After filling the holes, W is etched back to present a more planar upper surface upon which subsequent dielectrics and metallization levels can be placed. A problem inherent in the juncture between the tri-layer or glue layer and the W plug layer is the stress formed therein. The stress is primarily caused by dissimilar coefficients of thermal expansion between each layer. As described in Farahani et al., "Conventional Contact Interconnect Technology as an Alternative to Contact Plug (W) Technology for 0.485 μm CMOS EPROM IC Devices", *IEEE Trans on Semiconductor Manufacturing*, Vol. 17, No. 1, February 1994, the tensile stress associated with W film causes the W film to shrink during deposition. W film shrinkage is volumetric and has been shown to cause peeling at the interface between the dielectric and the TiN/Ti structure. Thus, peeling occurs primarily in the interface between Ti portion of the TiN/Ti/TiSi$_x$ glue layer and the dielectric. It is postulated that the cause of poor adherence to the dielectric is primarily due to the relative absence of a metallurgical interaction between TiN/Ti layer and the underlying dielectric.

It would therefore be advantageous to derive a fabrication process which optimizes the properties of the multi-layered metallization contact structure. Specifically, the contact structure must be formed using a single sputter deposition step and, more importantly, the Ti film defined in the junction region must be of a certain minimum thickness. Moreover, the TiN layer formed from the Ti film must be of a certain minimum thickness. Still further, the TiN/Ti/TiSi$_x$ glue layer must have excellent adherence in regions where adherence is oftentimes a problem. The derived fabrication methodology must therefore be capable of converting the lower portions of the ensuing tri-layer structure to a sufficiently thick TiSi$_x$ layer in regions where silicon is less prevalent (i.e., in the dielectric regions overlying the silicon substrate). Absent a relatively thick TiSi$_x$, tensile stress from overlying W plug layer will deleteriously contract and peel the glue layer away from the dielectric.

SUMMARY OF THE INVENTION

The problems outlined above are in large part solved by the metallization process of the present invention. That is, the metallization layer hereof is formed according to three-step, rapid thermal heating cycles. Specifically, a single sputter deposition step is used to form a Ti layer upon a semiconductor wafer. Thereafter, the Ti layer undergoes an ordered nitridation and silicidation. Nitridation of Ti above the junction and dielectric regions occurs at a controlled rate substantially prior to initiation of Ti silicidation.

Nitridation is carried out in a rapid thermal processor ("RTP") using an NH$_3$ ambient. A constant NH$_3$ gas flow is retained within the chamber as the chamber temperature undergoes three separate and distinct temperature cycles. The chamber is held at a first temperature for a set period of time to cause nitridation at the Ti upper surface. The first temperature is chosen to allow nitridation but is less than that necessary to initiate silicidation. By using NH$_3$ instead of N$_2$, nitridation can occur at a lesser temperature than that needed for silicidation. Accordingly, Ti overlying the junction region will have sufficient opportunity to form the thickest TiN layer possible prior to formation of silicide during the second and third temperature cycles.

The second temperature is immediately presented via the RTP (without measurable ramp up) to the Ti film. The second temperature is sufficient to initiate formation of silicide at the Ti-Si junction interface, yet not sufficient to form substantial amounts of silicide at the Ti-dielectric interface. The second temperature is, however, chosen in a way that forms the thickest possible TiN layer on the dielectric without any significant Si interdiffusions. The third temperature is chosen to not only convert the TiSi$_x$ to a stoichiometric TiSi$_2$, but is also used to form a thicker TiSi$_x$ or TiSi$_2$ at the Ti-dielectric interface.

Broadly speaking, the present invention contemplates a method for forming TiN and TiSi$_x$ upon a semiconductor wafer. The method comprises the steps of depositing a layer of Ti upon a semiconductor wafer. The Ti layer is then heated at a first temperature in the presence of NH$_3$ for a first period of time. The Ti layer is then heated at a second temperature in the presence of NH$_3$ for a second period of time subsequent to the first period of time. Thereafter, the Ti is heated for a third period of time in the presence of $NH_3$ and at a third temperature greater than the second and first temperatures. The third period of time is subsequent to the first and second periods of time. The three-step heating cycle is carried out in an RTP chamber. The first temperature is chosen between 600° C. to 610° C., and the anneal cycle occurs from 30 to 60 seconds. The second temperature cycle is thereafter carried out at a temperature between 700° C. to 750° C. for 20 to 40 seconds. Then, the third temperature cycle is instituted at a temperature between 800° C. to 850° C. for 10 to 30 seconds. The first, second and third temperature cycles are therefore used to maximize the TiN barrier layer overlying the junction region as well as to maximize the TiN and $TiSi_2$ layers overlying the dielectric region. The three temperature cycles and temperatures chosen for each cycle are crucial in producing appropriate barrier and silicide thicknesses for use in manufacturing a low voltage CMOS device. The present process achieves Ti film thickness at the junction region greater than 200 angstroms, such that the TiN film formed therefrom is of maximum thickness defined greater than 200 angstroms, and preferrably greater than 250 angstroms. Thus, the Ti film is deposited at preferrably 300 to 320 angstroms, leaving approximately 50 to 70 angstroms for silicide formation. The TiN film is thereby formed as a barrier or glue layer by rapid thermal nitridation of pure Ti film in $NH_3$ ambient.

BRIEF DESCRIPTION OF THE DRAWINGS

Other objects and advantages of the invention will become apparent upon reading the following detailed description and upon reference to the accompanying drawings in which.

Figure 1:
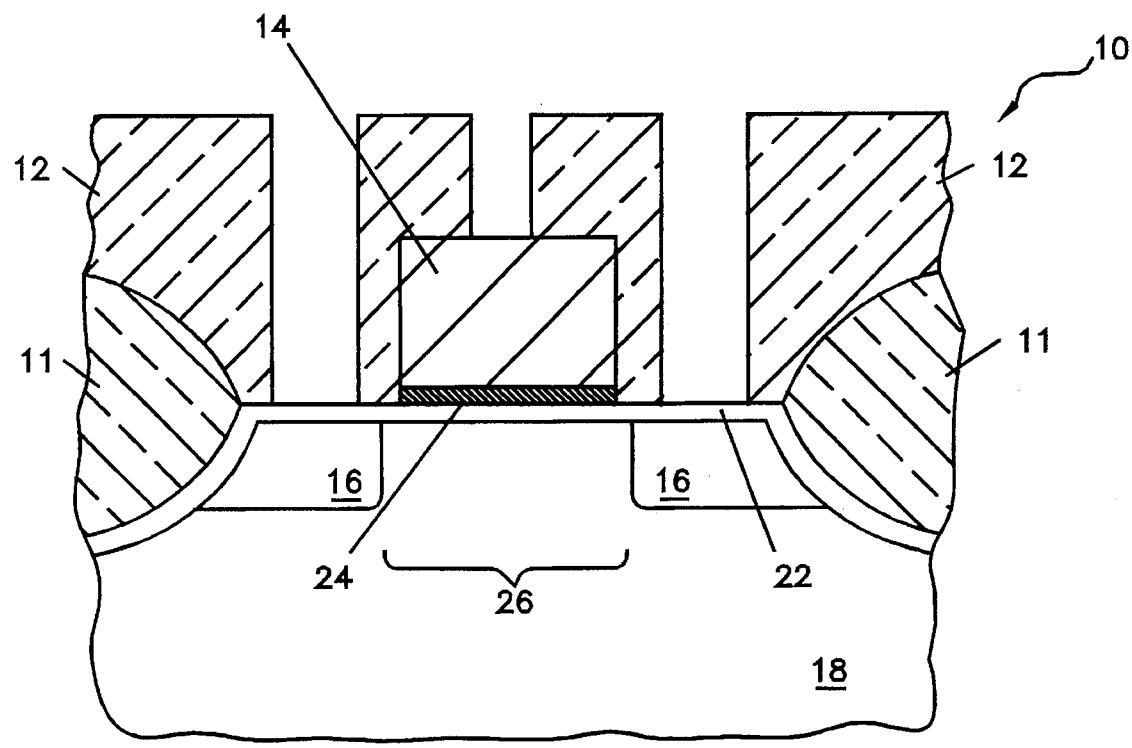
FIG. 1 is a cross-sectional view an electronic device partially formed according to metal oxide semiconductor (MOS) processing techniques.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a cross-sectional view of a partial semiconductor wafer 10 is illustrated having an MOS device formed at the upper topography of the wafer. Wafer 10 thereby includes dielectric 12 formed upon the semiconductor wafer topography (i.e., upon field regions 11 and gate conductor 14). Dielectric 12 is shown having portions removed using normal lithography steps. The removed portions thereby expose underlying gate conductor 12 and junction regions 16. Junction regions 16 are implanted into silicon substrate 18 using well-known ion implant techniques. Ions used to dope region 16 are of opposite impurity type than that of substrate 18.

It is understood in densely patterned active regions a spacer (not shown) may be used to form lightly doped drains (LDDs). Spacers and LDDs are not shown for sake of brevity and clarity; however, LDDs are known throughout VLSI processing. LDDs, and spacers associated therewith, help prevent problems such as "short channel effects" and associated "hot carrier injection". A threshold adjust/channel stop implant 22 may also be used to reduce subthreshold currents often associated with the short channel effects.

The device shown in FIG. 1 is illustrative of an MOS transistor fabricated with enhancements necessary to form a functional transistor at gate lengths less than, for example, 1.0 μm. It is also understood that the device can be either an enhancement mode or depletion mode transistor or can include a single transistor EPROM cell. Thus, in the latter instance, gate conductor 14 can be a stacked floating and control gate pair, well known in EPROM technology. Regardless of gate conductor 14 configuration, a thin gate oxide 24 is interposed between gate conductor 14 and channel 26 of silicon substrate 18. It is further understood that the upper topography of wafer 10 has many sites on which a subsequently deposited refractory metal can reside.

Figure 2:
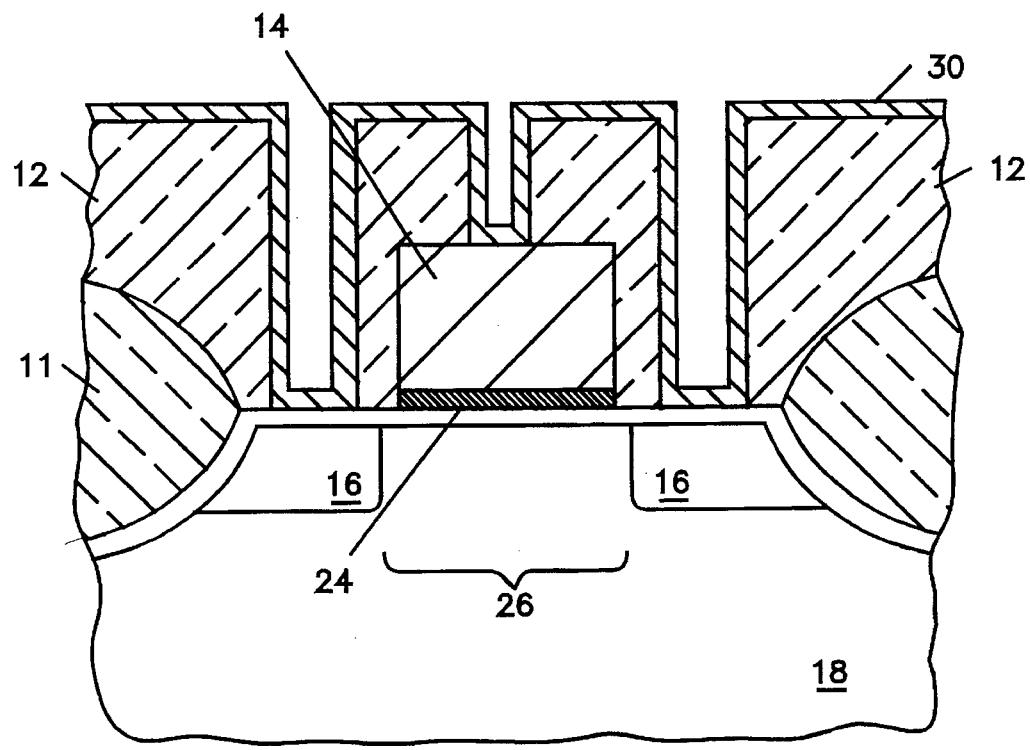
FIG. 2 is a cross-sectional view of the device of FIG. 1 having a Ti layer placed thereon.

As shown in FIG. 2, a layer of Ti refractory metal 30 is deposited across dielectric 12 and into openings formed through dielectric 12. Ti layer 30 is sputter deposited from a pure or substantially pure Ti target upon junctions 16 and dielectric 12. Dielectric 12 includes any interlevel dielectric material formed according to semiconductor processing, including PSG, BPSG, BPTEOS, spin-on glass, etc. Ti layer 30 is sputter deposited using a DC magnetron sputter apparatus within an inert ambient, such as Ar. The Ti layer is thereafter converted to a nitrogen-rich region at the upper surface and a silicon-rich region at the lower surface, wherein the silicon-rich region (i.e., silicide) abuts an ultra shallow source/drain junctions 16 less than, in many instances, 0.2 μm. The ensuing $TiN/Ti/TiSi_x$ trilayer is suited for formation upon contact regions less than, in many instances, 0.8 μm per side. Thus, the present process is advantageously used for high density VLSI devices. Furthermore, as will be described below, the present process is well suited for devices having either n- or p-type impurity regions 16 normally associated with CMOS processing.

Figure 3:
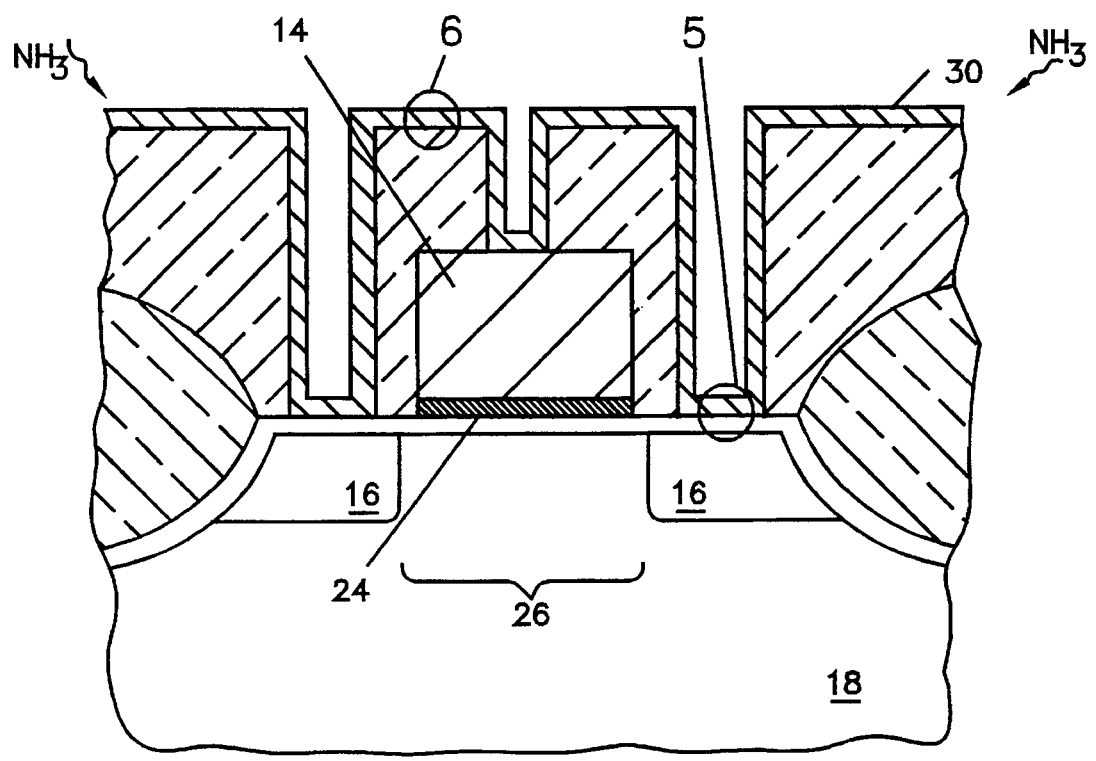
FIG. 3 is a cross-sectional view of the Ti-coated device undergoing a three-step anneal cycle according to the present invention.

Turning now to FIG. 3, an anneal of the previously deposited Ti layer 30 is shown. The anneal includes three anneal cycles or steps, each cycle is performed at a separate and unique temperature, and each cycle is performed in the presence of ammonia ($NH_3$). $NH_3$ is used as a nitridation agent of the exposed, upper portion of Ti layer 30. Nitridation process is designed according to the present invention to occur at a controlled rate relative to silicidation. The nitridation and silicidation rates are further described in reference to FIGS. 5 and 6 at portions 5 and 6 shown in FIG.

3. It is imperative that the amount and timing of nitridation (TiN) at the upper surface of layer 30 be carefully controlled with respect to the silicidation (TiSi$_x$) at the lower surface of layer 30. The respective rates and resulting amounts are controlled using a three-step nitridation/silicidation process hereof. The three-step process provides an appropriate TiN barrier thickness at regions 5 and 6 as well as an appropriate TiSi$_x$ silicide thickness at regions 5 and 6. Sufficient barrier thickness in region 5 ensures a junction leakage current less than, for example 1×10$^{-12}$ amperes and a junction breakdown voltage greater than, for example, 16 volts. Likewise, sufficient silicide thickness in region 6 assures good adherence between the TiN/Ti layer and underlying dielectric 12 when undergoing tensile contraction from an overlying plug layer, shown in FIG. 4.

Figure 4:
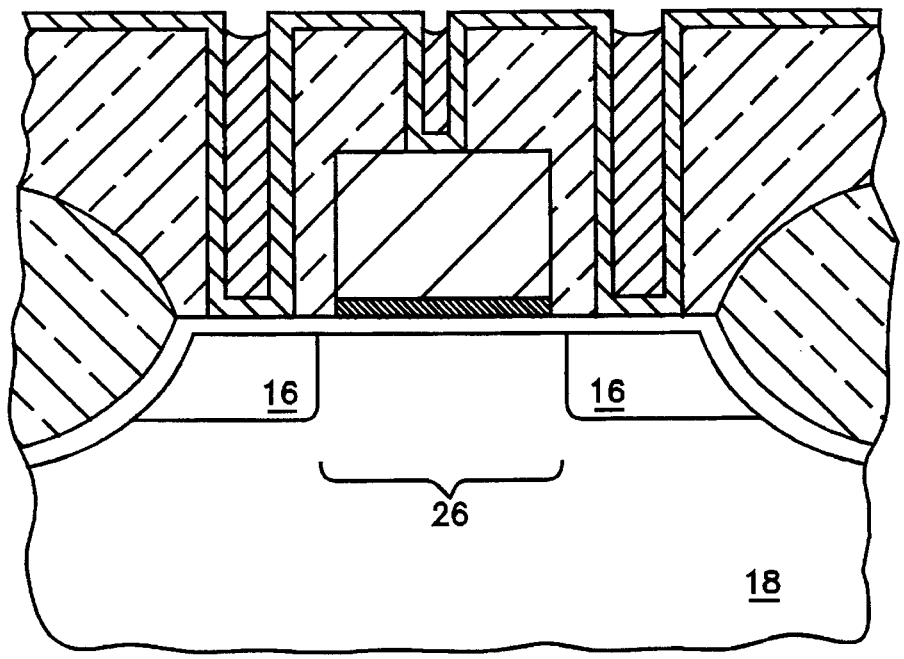
FIG. 4 is a cross-sectional view of the Ti-coated device having a plug layer placed thereon.

Turning now to FIG. 4, plug layer 32 is shown formed upon the Ti-coated semiconductor wafer after Ti nitridation. Plug layer 32 includes a conductive material, preferably W. When using plug layer 32, the glue layer TiN/Ti/TiSi$_x$ structure formed from Ti layer 30 serves to adhere W layer 32 to underlying layers, such as dielectric layer 12 and junction region 16. The glue layer must provide sufficient adhesion between plug layer 32 and dielectric 12 in order to prevent problems of peeling described above. One way in which to assure proper adhesion is to maintain adequate interaction between the glue layer and the dielectric over areas where adhesion is normally a problem. Mainly, it is important that the glue layer have sufficient silicide upon dielectric 12 where Si atoms are less prevalent. Formation of silicide above sparse Si regions is generally more difficult than in areas where silicide is more prevalent.

Figure 5A:
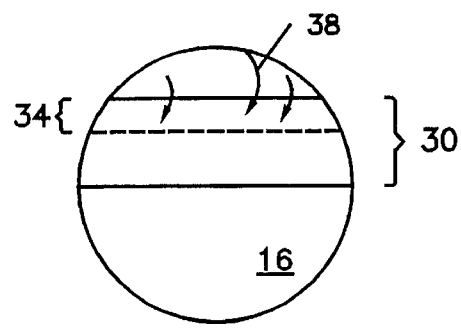
FIGS. 5a–5c are detailed cross-sectional views of respective three-step anneal cycles within area 5 of FIG. 3.
Figure 5B:
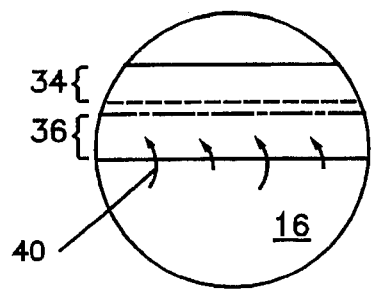
Figure 5C:
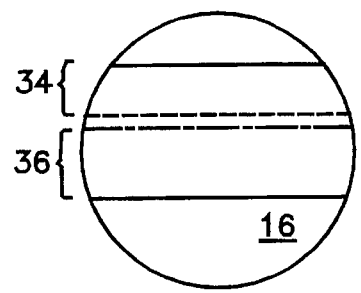

Turning now to FIGS. 5a–5c, a detailed cross-sectional view of area 5 in FIG. 3 is shown during a three-step anneal cycle. FIG. 5a illustrates the first temperature cycle in which Ti layer 30 is subjected to NH$_3$ at a temperature between 600° to 610° C. for 30 to 60 seconds. As a result of the first temperature cycle, a nitridation occurs at the upper surface to form a TiN layer 34. FIG. 5b illustrates a separate and distinct second anneal cycle performed at a temperature between 700° to 750° C. for 20 to 40 seconds. Resulting from the second temperature cycle, silicidation in initiated, wherein a TiSi$_x$ layer 36 begins to form at the lower portion of Ti layer 30. Thus, arrows 38 in FIG. 5a indicate ingress and diffusion of nitrogen atoms from the NH$_3$ ambient into layer 34. Similarly, arrows 40 indicate ingress of silicon atoms from region 16 into layer 36. According to the two steps shown in FIGS. 5a and 5b, nitridation is purposefully performed before substantial amounts of silicidation have occurred. At typical implant doses of approximately 10$^{16}$ atoms/cm$^2$ of boron within a p-type impurity region 16, migration of silicon at temperatures below 700° C. do not substantially occur, therefore, the first, lower temperature cycle will produce primarily TiN instead of TiSi$_x$. It is not until the second and higher temperature level of approximately 700° C. will silicidation begin. Thus, the first temperature step is used to fix a given thickness of TiN barrier within the contact region prior to silicidation. Nitridation can therefore be performed to substantial entirety before silicidation is initiated. The TiN layer is formed to a maximum thickness of approximately 200 to 250 angstroms within a pre-existing Ti film greater than 200 to 250 angstroms (i.e., in a Ti film of approximately 250 to 320 angstroms).

FIG. 5c illustrates a third temperature cycle separate and distinct from the first and second temperature cycles of FIGS. 5a and 5b, respectively. Specifically, the third temperature cycle occurs after the second temperature cycle is completed. The third temperature cycle takes place at a temperature between 800° C. to 850° C. for 10 to 30 seconds. The elevated temperature is used to enhance the silicidation process and convert previously formed TiSi$_x$ to a lower resistivity silicide, one which is more atomically stable at the operating temperatures of the device. Namely, the third temperature cycle converts predominant amounts of TiSi$_x$ to TiSi$_2$. It is postulated that small amounts of nitridation will occur in area 5 in the third step but be substantially minimized through the presence of the growing TiSi$_x$ film. The competing nature of each layer within the tri-layer structure will help minimize additional growth of those layers, even at elevated temperatures.

Figure 6A:
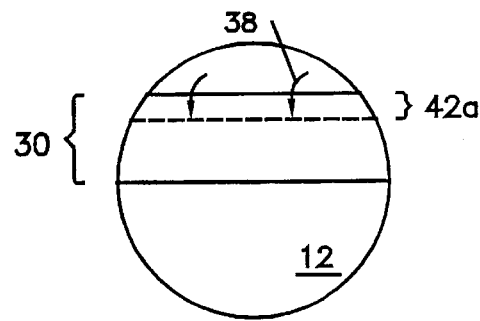
FIGS. 6a–6c are detailed cross-sectional views of respective three-step anneal cycles within area 6 of FIG. 3.
Figure 6B:
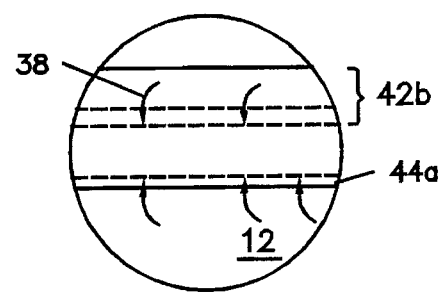
Figure 6C:
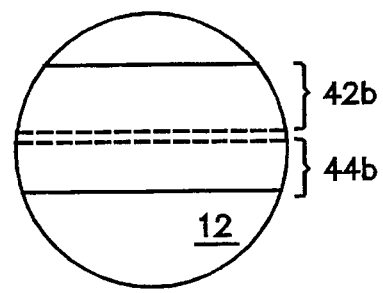

Turning now to FIGS. 6a through 6c, detail of area 6 within FIG. 3 is shown at three temperatures cycles identical to those cycles used in defining FIGS. 5a through 5c, respectively. FIG. 6a illustrates the result of the first temperature cycle upon Ti layer overlying dielectric 12. Nitrogen atoms 38 from the NH$_3$ will diffuse into the upper surface of Ti layer 30 to form TiN layer 42a. In the second temperature cycle shown in FIG. 6b, thickening of TiN layer 42a to layer 42b occurs. However, as shown in FIG. 6b, only negligible amounts of layer 30 will convert to silicide at the temperature specified in the second anneal cycle. The silicide layer as shown in reference numeral 44a is therefore generally quite thin in comparison to the silicide layer 36 shown in FIG. 5b. The primary reason for a thinner silicide in region 6 than that of region 5 is primarily due to a lower concentration of "free" Si atoms within dielectric 12 relative to Si atoms within region 16. Therefore, a higher temperature, third anneal cycle is necessary to form sufficient silicide, as shown in FIGS. 5c and 6c. Specifically, FIG. 6c illustrates a thickening of silicide layer 44a to 44b. A thickening of silicide layer 44b is necessary to enhance the adhesion of the TiN/Ti to underlying dielectric 12 via TiSi$_s$. Using the three distinct and individual temperature cycles, each within NH$_3$ ambient helps ensure a maximum barrier thickness 34 over junction 16 and dielectric 12 as well as to ensure a maximum silicide thickness 44b over dielectric 12.

Figure 7A:
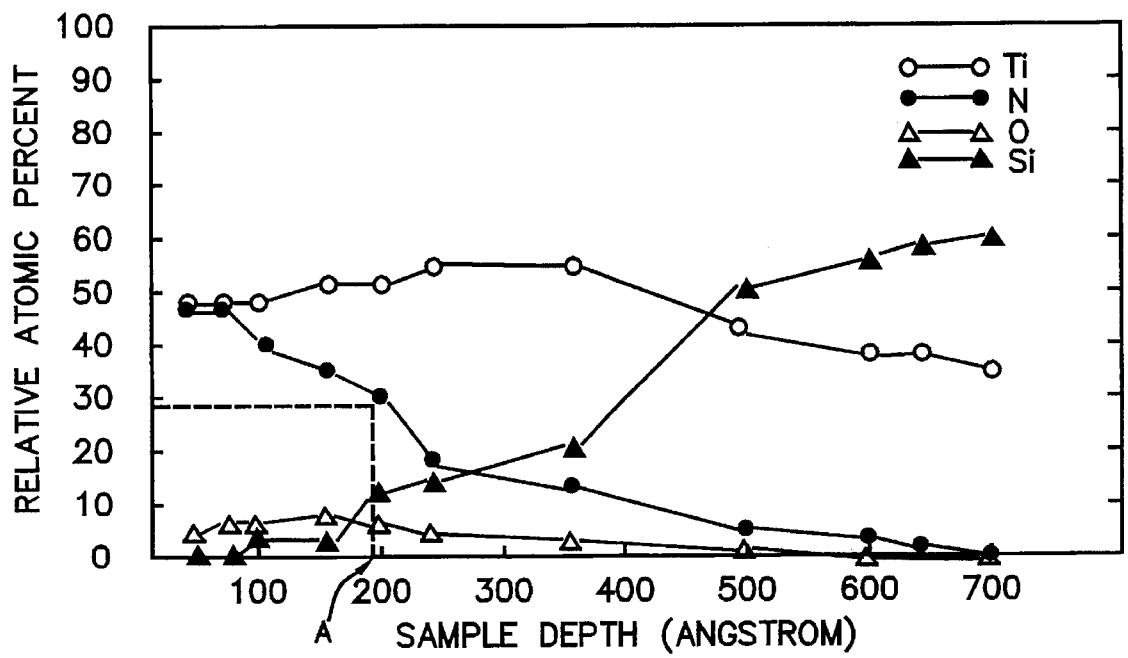
FIG. 7a–7c are graphs of electron spectroscopy for chemical analysis (ESCA) readings taken from the Ti film overlying a p-type junction, wherein the Ti film undergoes 590° C., 610° C. and 650° C. heating, respectively.
Figure 7B:
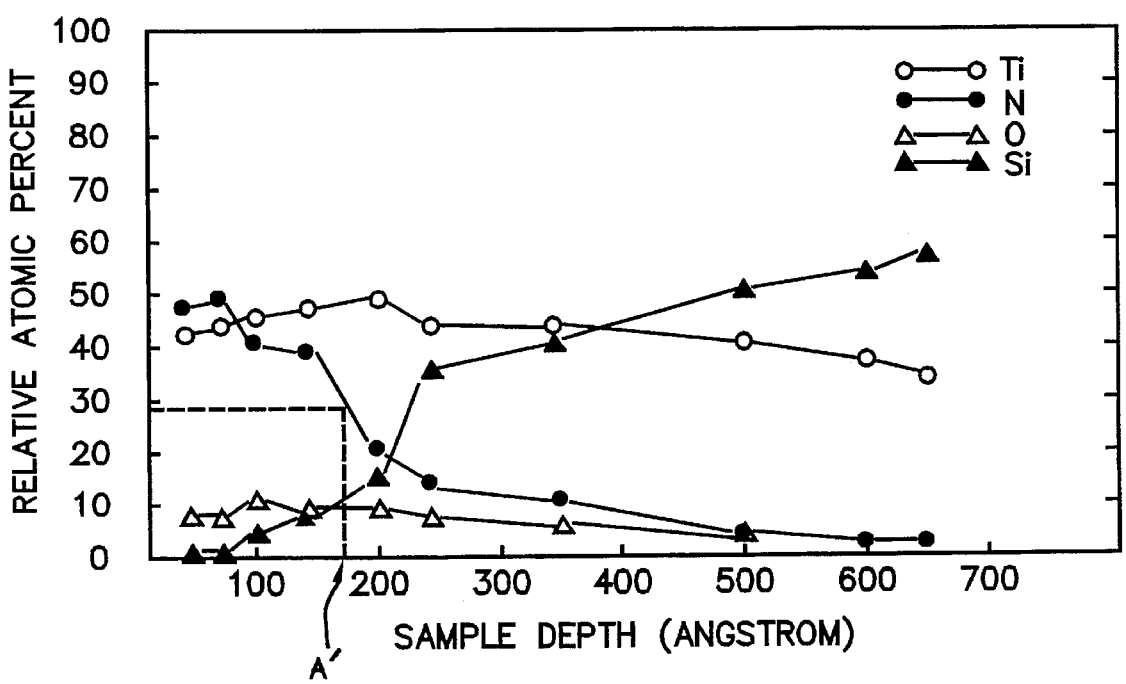
Figure 7C:
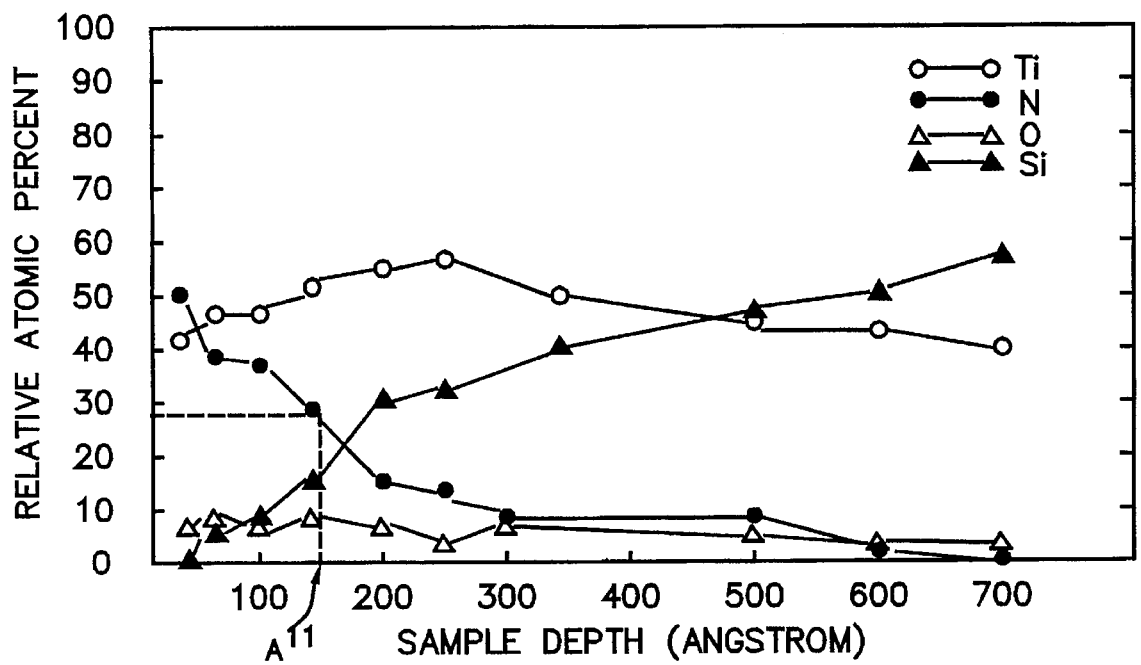

Turning now to FIG. 7a, a graph of atomic species as defined in atomic percent shown is plotted with respect to sample depth within Ti layer 30. Specifically, FIG. 7a illustrates atomic species concentration within Ti layer 30 overlying source/drain junctions 16 resulting from a 590° C. anneal within a NH$_3$ ambient. FIG. 7b illustrates the same conditions but under a higher temperature 610° C. anneal. FIG. 7c illustrates yet a higher temperature 650° C. anneal. A comparison of FIG. 7a through 7c indicates a deeper concentration level A at 590° C. than that of concentration levels A' and A". Based on the experimental results, as temperature increases beyond a threshold amount, N concentration decreases accordingly. It is contemplated that the maximum, or threshold temperature amount which produces a maximum nitrogen depth is between 590° C. and 610° C., and more preferably between 600° C. and 610° C.

The analyses were performed using electron spectroscopy for chemical analysis (ESCA). ESCA employs low energy X-rays to cause a readable photoelectron emission. Photoelectron emission, when read, allows analysis of the chemical composition at various elevational levels within the sample Ti layer. ESCA techniques are well known to the skilled artisan as being one way in which to determine atomic species within a target substance. The ESCA experiments were performed on a Ti layer overlying a junction implanted with 6×10$^{15}$ atoms/cm$^2$ of boron. The p-type junction depth from which experiments were taken was formed at 0.4 μm. The Ti film was sputter deposited from a DC magnetron sputtering system at approximately 800 to 1100 angstroms in thickness. The NH₃ flow used to diffuse nitrogen within the sample was set at approximately 3500 sccm during the entire heat treatment process, and the temperatures defined in FIGS. 7a through 7c were set at 590° C., 610° C. and 650° C., respectively, with less than 5° C. variance. The experimental ESCA results were verified using other material characterization techniques, such as rutherford backscattering spectroscopy (RBS). A p-type junction material was chosen as worst case material for reasons described above. It is contemplated that a thicker TiN layer will be formed over n-type junction than that of p-type junction. The TiN resultant phase layer is also defined as a layer having at least 29.5 atomic percent N, and generally between 29.5 atomic percent and 53.7 atomic percent N. Thus, levels A, A' and A" indicate a minimum atomic percent necessary to form TiN phase at the upper surface of Ti layer 30. The TiN layer formed upon the junction in region 5 is therefore shown at a maximum in FIG. 7a of nearly 240 Angstroms in thickness. Any atomic percent of nitrogen less than 29.5 is deemed not sufficient to form what is defined herein as TiN, and therefore would not contribute to TiN layer thickness, shown as reference numeral 34 in FIGS. 5a–5c and as reference numeral 42a and 42b in FIGS. 6a–6c.

Figure 8A:
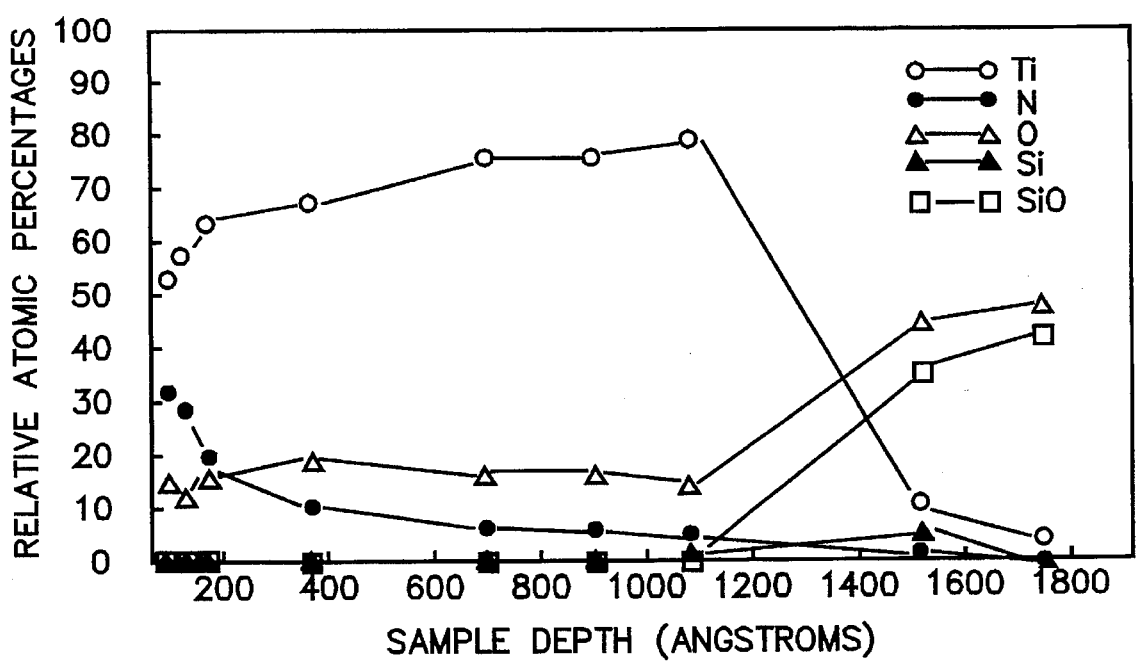
FIGS. 8a–8c are graphs of ESCA readings taken from the Ti film overlying a dielectric, wherein the Ti film overlying a 1000 angstrom oxide undergoes 550° C., 650° C. and 700° C. heating, respectively.
Figure 8B:
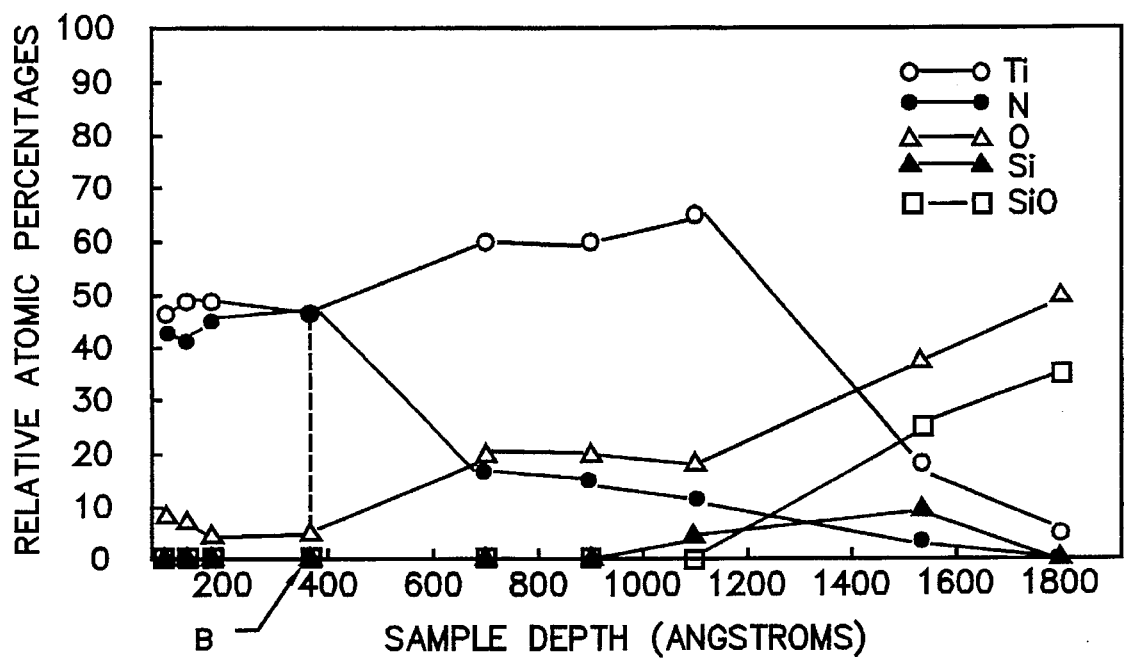
Figure 8C:
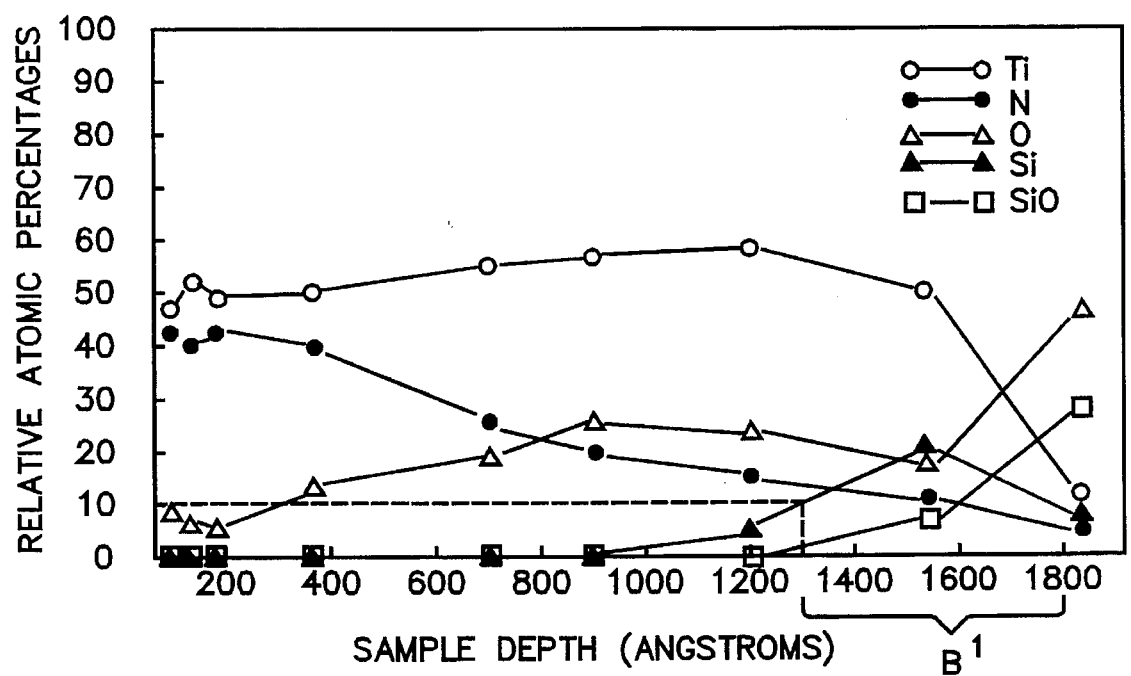

The experimental results shown in FIGS. 7a–7c illustrate a temperature range necessary to form at least 200 to 240 angstroms TiN thickness. A temperature level above, for example, 610° C. will not extend the TiN thickness in Ti layer overlying p-type source/drain junctions 16. Thus, the experimental results demonstrate that the first temperature cycle shown in FIGS. 5a and 6a produce a maximum TiN layer 34 prior to silicidation. FIGS. 8a–8c are graphs which illustrate atomic percentages of species within Ti layer 30 as measured in area 6 overlying dielectric 12. Specifically, FIGS. 8a–8c indicate anneal temperatures of 550° C., 650° C. and 700° C., respectively. The starting parameters of Ti layer thickness and NH₃ flow rate remains consistent with that used in deriving the results of Figs. 7a–7c. The comparison of FIGS. 8a and 8b indicate, at higher temperature, the N/Ti atomic percent ratio approaches 1.0 at a depth of approximately 350 Angstroms, as shown at point B. At temperatures of 700° C., shown in FIG. 8c, N concentration decreases slightly, but penetrates deeper into the Ti layer. Thus, the second temperature of 700° to 750° C. appears to present a deeper penetration of N within the Ti layer 30 overlying dielectric 12. More importantly, a comparison of FIGS. 8b and 8c indicate a high concentration of Si species at elevated temperatures. FIG. 8c indicates that at temperatures of approximately 700° C., Si penetrates from the lowermost portion of Ti layer 30. At the lower temperatures shown in FIGS. 8a and 8b, Si concentration appears never to exceed 10 percent, whereas FIG. 8c indicates a Si concentration exceeding 10 percent at point B'. The second temperature cycle is therefore used not only to increase the TiN thickness but also to create free Si atoms from overlying dielectric 12.

FIGS. 8a–8c are derived from experimental results using ESCA material characterization techniques. Graphs 8a–8c were derived from rapid thermal heat treatment chambers having a NH₃ ambient, and the resulting sample is a sputter-deposited Ti layer formed upon a dielectric. Sputter deposition is carried forth in a DC magnetron sputtering apparatus, and the dielectric pre-exists at a thickness of 800 to 1000 angstroms. Each temperature cycle resulting in graphs 7a–8c was performed at a duration of approximately 90 seconds. The experimental procedures and parameters used to define the illustrated results are fully described and set forth in Farahani, et al., "A Study of Electrical, Metallurgical and Mechanical Behavior of Rapid Thermal Processed Films in NH₃", JR. of Electrochemical Society, Vol. 1,141, No. 2, February, 1994 (herein incorporated by reference).

It will be appreciated to those skilled in the art having the benefit of this disclosure that this invention is believed to be capable of applications with numerous metallization schemes upon vastly dissimilar silicon substrate topographies. Moreover, it is also to be understood that the form of the invention shown and described is to be taken as exemplary preferred embodiments. Various modifications and changes may be made without departing from the spirit and scope of the invention set forth in the claims. It is intended that the following claims be interpreted to embrace all such modifications and changes.

What is claimed is:

1. A method for forming titanium nitride and titanium silicide upon a semiconductor wafer, comprising:

depositing a layer of titanium upon a semiconductor wafer;

first heating the layer of titanium in the presence of NH₃ at a first temperature sufficient to cause a nitridation of said titanium for a first period of time;

second heating the layer of titanium in the presence of NH₃ at a second temperature greater than said first temperature for a second period of time subsequent to said first period of time; and third heating the layer of titanium in the presence of NH₃ at a third temperature greater than said second temperature for a third period of time subsequent to said second period of time.

2. The method as recited in claim 1, wherein said first heating step comprises placing said titanium-deposited semiconductor wafer in a rapid thermal processor chamber heated to a temperature between 600° and 610° C. for 30 to 60 seconds.

3. The method as recited in claim 1, wherein said semiconductor wafer comprises silicon substrate and silicon oxide surfaces upon which said layer of titanium is deposited, and wherein said first heating step comprises converting between 200 and 240 angstroms of titanium which overlays said silicon substrate to titanium nitride.

4. The method as recited in claim 3, wherein said titanium nitride compound includes an atomic percentage of nitrogen in the range of 29 to 54% relative atomic weight.

5. The method as recited in claim 1, wherein said second heating step comprises placing said titanium-deposited semiconductor wafer in a rapid thermal processor chamber heated to a temperature between 700° and 750° C. for 20 to 40 seconds.

6. The method as recited in claim 1, wherein said semiconductor wafer comprises silicon substrate and silicon oxide surfaces upon which said layer of titanium is deposited, and wherein said second heating step comprises:

initiating the conversion of titanium which overlays said silicon substrate to titanium silicide; and simultaneously converting between 650 and 720 angstroms of titanium which overlays said silicon oxide to titanium nitride.

7. The method as recited in claim 6, wherein said titanium nitride compound includes an atomic percentage of nitrogen in the range of 29 to 54% relative atomic weight.

8. The method as recited in claim 1, wherein said third heating step comprises placing said titanium-deposited semiconductor wafer in a rapid thermal processor chamber heated to a temperature between 800° and 850° C. for 20 to 30 seconds.

9. The method as recited in claim 1, wherein said semiconductor wafer comprises silicon substrate and dielectric surfaces upon which said layer of titanium is deposited, and wherein said third heating step comprises converting a titanium-silicon mixture which overlays said dielectric and silicon substrate to titanium disilicide.

10. The method as recited in claim 1, further comprising depositing a layer of tungsten upon said titanium-deposited semiconductor substrate after said first, second and third heating steps.

11. The method as recited in claim 1, wherein said first, second and third heating steps occur within a single heating chamber without opening said chamber intermediate said heating steps.

12. A method for forming between 200 and 240 angstroms of titanium nitride within a titanium layer which overlays a p-type silicon substrate prior to forming titanium silicide within said titanium layer, comprising:

depositing a layer of titanium upon a silicon substrate previously implanted with p-type ions;

first heating the layer of titanium in the presence of $NH_3$ ambient at 600° to 610° C. for 30 to 60 seconds to form a layer between 200 and 240 angstroms of titanium nitride within an upper portion of said titanium layer; and second heating the layer of titanium in the presence of $NH_3$ ambient at 700° to 750° C. for 20 to 40 seconds to initiate formation of a layer of titanium silicide within a lower portion of said titanium layer.

13. The method as recited in claim 12, wherein said first and second heating step comprise placing said titanium-deposited silicon substrate in a heated rapid thermal processor chamber.

14. A method for forming between 650 and 700 angstroms of titanium nitride within a titanium layer which overlays a dielectric prior to forming titanium silicide within said titanium layer, comprising:

forming an oxide upon a silicon substrate;

depositing a layer of titanium upon said oxide;

first heating the layer of titanium in the presence of $NH_3$ ambient at 700° to 750° C. for 20 to 40 seconds to form a layer between 500 and 620 angstroms of titanium nitride within an upper portion of said titanium layer; and second heating the layer of titanium in the presence of $NH_3$ ambient at 800° to 850° C. for 10 to 30 seconds to form a layer of titanium silicide within a lower portion of said titanium layer.

15. The method as recited in claim 14, wherein said first and second heating step comprise placing said titanium-deposited dielectric in a heated rapid thermal processor chamber.

16. The method as recited in claim 14, further comprising depositing a layer of tungsten upon said titanium-deposited dielectric after said first, second and third heating steps.

* * * * *